(12) United States Patent
Zu

(10) Patent No.: US 8,152,048 B2
(45) Date of Patent: Apr. 10, 2012

(54) METHOD AND STRUCTURE FOR ADAPTING SOLDER COLUMN TO WARPED SUBSTRATE

(75) Inventor: Longqiang Zu, Palo Alto, CA (US)

(73) Assignees: Taiwan Semiconductor Manufacturing Co., Ltd., Hsin-Chu (TW); Global Unichip Corporation, Hsin-Chu (TW)

( * ) Notice: Subject to any disclaimer, the term of this patent is extended or adjusted under 35 U.S.C. 154(b) by 669 days.

(21) Appl. No.: 12/331,154

(22) Filed: Dec. 9, 2008

(65) Prior Publication Data

US 2010/0143656 A1 Jun. 10, 2010

(51) Int. Cl.
*B23K 35/12* (2006.01)
(52) U.S. Cl. ........................ 228/245; 228/103
(58) Field of Classification Search .......... 228/245, 228/103
See application file for complete search history.

(56) References Cited

U.S. PATENT DOCUMENTS
2005/0051604 A1* 3/2005 Claver et al. ............. 228/180.22

OTHER PUBLICATIONS

"Ceramic Column Grid Array Package," Actel Corporation, Application Note AC190, Sep. 2003, pp. 1-7.
Yeh, C.P., et al., "Experimental and Analytical Investigation of Thermally Induced Warpage for Printed Wiring Boards," 1991, IEEE, pp. 382-387.
Park, S.B., et al., "Characterization of Thermo-Mechanical Behaviour of Pb Free Ceramic Column Grid Array—CCGA Package Using Moire Interferometry," (online) http://www.me.binghamton.edu/O.M.R.L/Rahul&Dr.Park-CuCGA.html, downloaded Aug. 7, 2008, 3 pgs.
Interrante, Mario, et al., "Lead-Free Package Interconnections for Ceramic Grid Arrays," 2003, IEEE/CPMT/SEMI Int'l Electronics Manufacturing Technology Symposium, IEEE, pp. 85-92.

* cited by examiner

*Primary Examiner* — Jessica L Ward
*Assistant Examiner* — Nicholas D'Aniello
(74) *Attorney, Agent, or Firm* — Slater & Matsil, L.L.P.

(57) ABSTRACT

A multiple substrate system, a method, and structure for adapting solder volume to a warped module. An illustrative embodiment comprises a method for joining a first substrate to a second substrate. A deviation from a nominal gap between the first substrate and the second substrate at a first region of the first substrate is ascertained. A volume of solder paste necessary to compensate for the deviation from a nominal gap is determined. The volume of solder paste necessary to compensate for the deviation at the first region of the first substrate is applied. Further, the second substrate is bonded to the first substrate using, at least in part, the solder paste applied at the first region of the first substrate.

9 Claims, 11 Drawing Sheets

METHOD AND STRUCTURE FOR ADAPTING SOLDER COLUMN TO WARPED SUBSTRATE

TECHNICAL FIELD

The present invention relates generally to multi-substrate assemblies and more particularly to adapting solder volume to accommodate a warped module.

BACKGROUND

A multi-substrate assembly package may contain several die packages and multiple die systems or modules in a package. System in Package (SiP) is a number of integrated circuits enclosed in a single module. Multiple dies may be stacked vertically or horizontally connecting to a SiP interposer. An interposer comprises a multi-layer substrate that interconnects the active areas on the top-side of the interposer with the active areas connected to the back-side of the interposer. The multiple dies may be internally connected by fine wires that are bonded to the interposer or package. Alternatively, with flip chip technology, solder bumps are used to join the die to the SiP interposer. Despite the benefits of multichip modules including SiPs, problems such as warpage of a SiP module interposer may create challenges during integration of the module into a multi-substrate assembly.

The module interposers may be thin in comparison to the surface area on which components are mounted. Some interposers are made with dimensionally stable material, such as ceramics, however, many interposers are comprised of materials such as multiple layers of Cu, polyimide or Cu, fiberglass resin (FR4), and the like, that are semi-rigid and may flex during process temperatures. The flexibility of the interposers may allow the module packages to warp in the axis perpendicular to the major surface areas or in the Z dimension.

Ball-grid array (BGA) packages, for example, ideally have a rectangular mounting surface that is generally planar. The mounting surface may be covered with small spherical leads that carry electric signals to and from the active areas that are a part of the multiple integrated circuit module. However, under certain conditions, an SiP BGA interposer may warp causing a warped mounting surface on the BGA module. A warped BGA module may create bridged or open solder joints between the SiP BGA substrate and a printed circuit board (PCB) surface of the multi-substrate assembly package.

Further, warpage of a module may create significant measurable differences from solder joint to solder joint across the surface of an assembly package. First, as discussed above, the substrate material may warp resulting in a significant variation in the relative distances between the mounting surfaces of the substrate and the PCB. Generally, BGA packages warp such that the edges tend to pull away from the mounting surface of the PCB. However, it should be appreciated the BGA substrate warp can occur in a host of various ways with the distance between the mounting surfaces of a BGA substrate and a PCB varying in a number of different ways across the mounting surfaces. Other packages, such as, but not limited to, column grid array (CGA), flip-chip, chip scale packages (CSPs), and quad flat packs may also warp. Secondly, a difference in non-shorted or non-bridged solder joints may be problematic because of solder columns with irregular diameters causing reliability concerns.

These and other factors may work together such that a multi-substrate assembly may contain a plurality of multi-pin devices with a significant variation in one or more solder joint measurements. For example, in the case of solder columns in which a substantially uniform volume of solder paste is applied to the mounting surface of the assembly PCB, an increase in the distance between the mounting surfaces of the BGA module and the PCB may cause one or more solder columns to open. A decrease in the distance between the mounting surfaces of the BGA module and the PCB may cause a bridge between two adjacent solder columns. An open or bridge may likely cause a failure of the workpiece. Prior art methods of working around these problems include limiting module size, therefore limiting module warpage, limiting module materials, such that all components of the module have closer coefficients of thermal expansion, and scrapping warped modules. A disadvantage of the prior art is that warped packages bonded to a PCB may have open or bridged solder joints.

What is needed then, is a new method and structure for adapting solder volume to a warped substrate that overcomes the above described shortcomings in the prior art.

SUMMARY OF THE INVENTION

These and other problems are generally solved or circumvented, and technical advantages are generally achieved by a method and structure for adapting solder volume to a warped module.

A multiple substrate system, a method, and structure for adapting solder volume to a warped module. An illustrative embodiment comprises a method for joining a first substrate to a second substrate. A deviation from a nominal gap between the first substrate and the second substrate at a first region of the first substrate is ascertained. A volume of solder paste necessary to compensate for the deviation from a nominal gap is determined. The volume of solder paste necessary to compensate for the deviation at the first region of the first substrate is applied. Further, the second substrate is bonded to the first substrate using, at least in part, the solder paste applied at the first region of the first substrate.

Advantages of preferred embodiments of the present invention include providing a method to bond warped modules to an assembly substrate, thereby allowing larger module sizes and reducing module and assembly scrap.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which:

FIG. 1A shows the workpiece before the module and substrate are joined, FIG. 1B shows the workpiece after surface mount and FIG. 1C shows the workpiece after reflow;

FIG. 2A shows the workpiece before surface mount and FIG. 2B shows the workpiece after reflow;

FIG. 3A shows the workpiece before surface mount and FIG. 3B shows the workpiece after reflow;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely a multi-substrate assembly having a single warped substrate. The invention may also be applied, however, to other multi-substrate assemblies comprising multiple warped substrates.

Figure 1A:
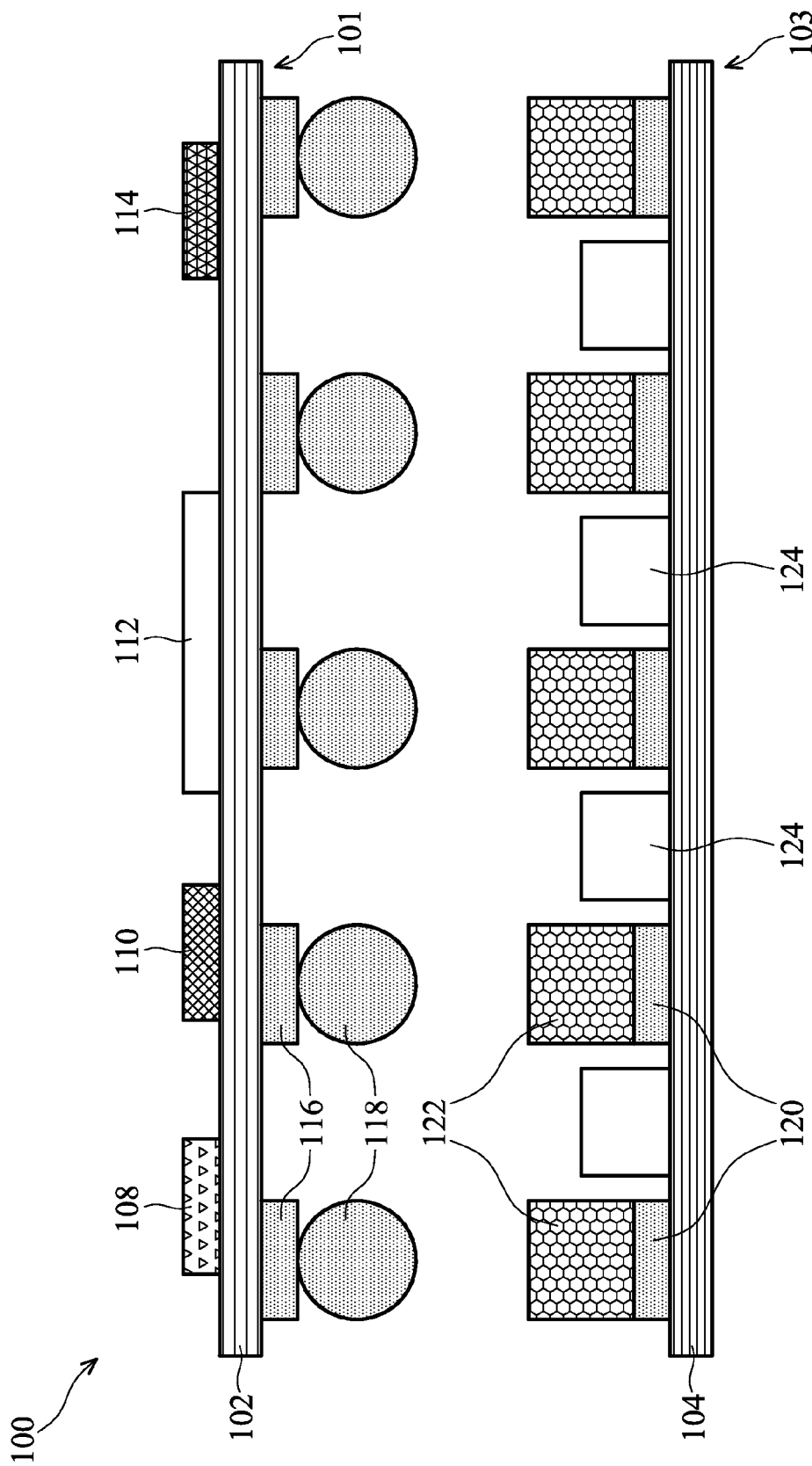
FIGS. 1A-1C are cross-sectional views of a multi-substrate assembly.

With reference now to FIG. 1A, a workpiece is shown before reflow. Workpiece 100 comprises module 101 and PCB substrate 103. Module 101 is comprised of interposer 102 with multiple devices 108, 110, 112, and 114 mounted onto the top surface of interposer 102. Interposer 102 may be comprised of multiple layers of conductors and insulators such as polyimide or FR4, or the like, forming an interconnecting substrate for the devices mounted on interposer 102. Bond pads 116 are shown on the back-side of interposer 102. Attached to bond pads 116 are solder balls 118. Module 101 is a ball grid array (BGA) package. Devices 108, 110, 112, and 114 may be packaged devices, direct die attach devices, or the like. Devices 108, 110, 112, and 114 may be a combination of package types and sizes bonded to interposer 102 forming module 101.

Substrate 104 may be a PCB comprising layers of metal and fiberglass, or the like. Substrate 104 may have solder pads 120 to accept other components in addition to module 101 (not shown). In another embodiment, substrate 104 may be an interposer allowing additional substrates to be mounted to the back-side of substrate 104. In this embodiment, substrate 104 is a PCB with solder pads 120 attached to the top-side of substrate 104. Solder mask 124 is applied on substrate 104 before solder paste 122 is printed to protect the areas of substrate 104 that do not receive solder paste 122. Solder mask 124 may be applied so that there is a space between solder pads 120 and solder mask 124. During solder paste print process there may be a slight misalignment of solder paste 122. In the case wherein the solder paste doesn't contact the solder mask, the solder paste may align over the solder pad due to the surface tension of the solder at liquidus. Therefore, a solder mask free space surrounds solder pads 120. Solder paste 122 is printed on solder pads 120. Solder pads 120 are flat, tin-lead, silver, or gold plated copper pads, for example. Solder paste 122 comprises a tacky mixture of flux and solder particles, or the like. Solder paste is applied to the solder pads with a stencil. A stencil is a thin flat material, such as stainless steel that has apertures through which solder paste 122 is applied or printed. After printing, module 101 is placed on substrate 104 in a pick-and-place machine. Small components may be delivered to the production line on paper or plastic tapes wound on reels. Larger modules, such as module 101, may be delivered stacked in static-free plastic tubes or trays. Pick-and-place machines remove the parts, such as module 101, from the reels or tubes and place them on a PCB, such as substrate 104.

Figure 1B:
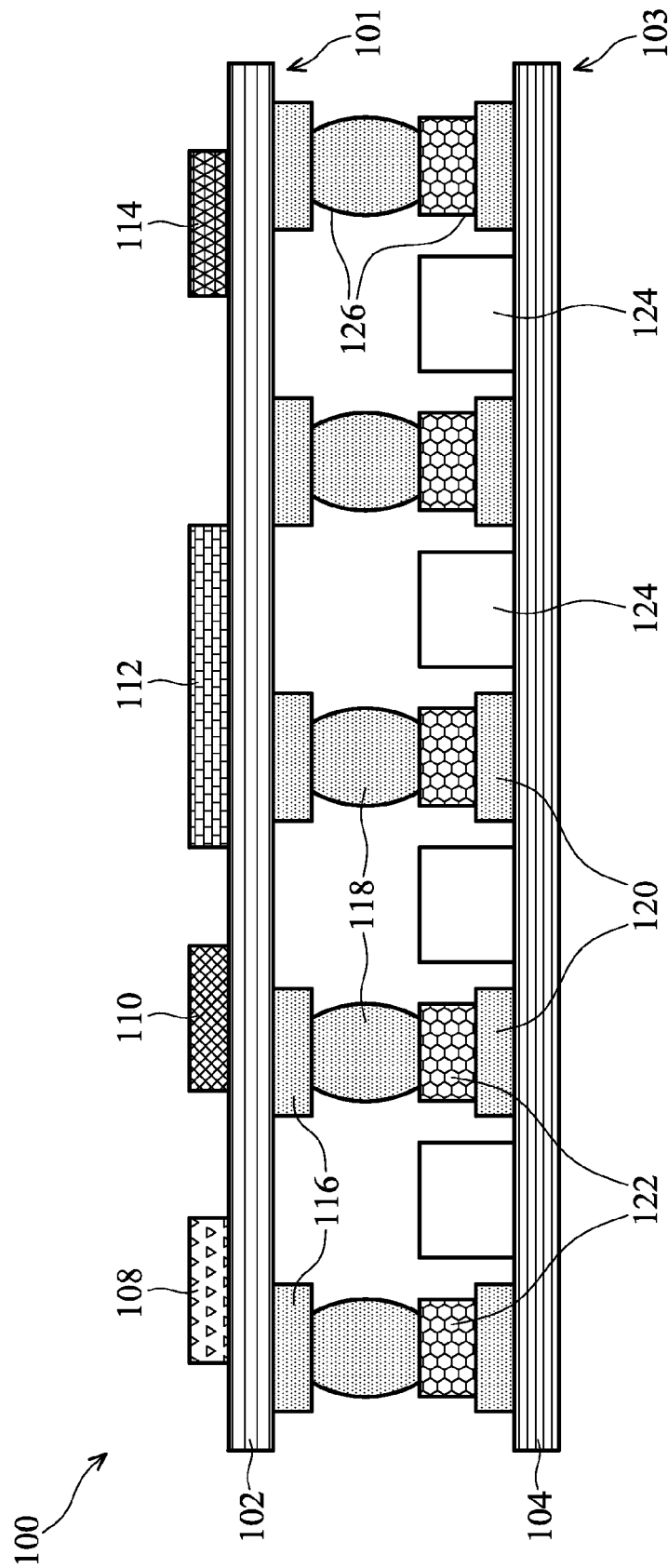

Workpiece 100 is then conveyed into a reflow soldering oven. FIG. 1B shows workpiece 100 following pick-and-place and in the process of reflow. Module 101 is aligned to substrate 104, solder balls 118 to respective solder paste 122. Due to the surface tension of the solder, the solder ball and the solder paste tend to align forming solder cylinder 126.

In the reflow process, workpiece 100 first enters a pre-heat zone, where the temperature of substrate 104 and the components being bonded, including module 101, may be gradually and uniformly raised. This helps minimize thermal stresses when the assemblies, such as workpiece 100, cool down after soldering. Workpiece 100 then enters a zone where the temperature is high enough to melt the solder particles in solder paste 122, and solder balls 118, thus bonding module 101 solder balls 118 to solder pads 120 on substrate 104. The surface tension of the molten solder keeps module 101 in place and the surface tension aids in aligning the solder balls 118 on module 101 to solder pads 120. The surface tension allows a low height large radius solder paste volume to decrease in radius and grow in height to form solder columns.

Figure 1C:
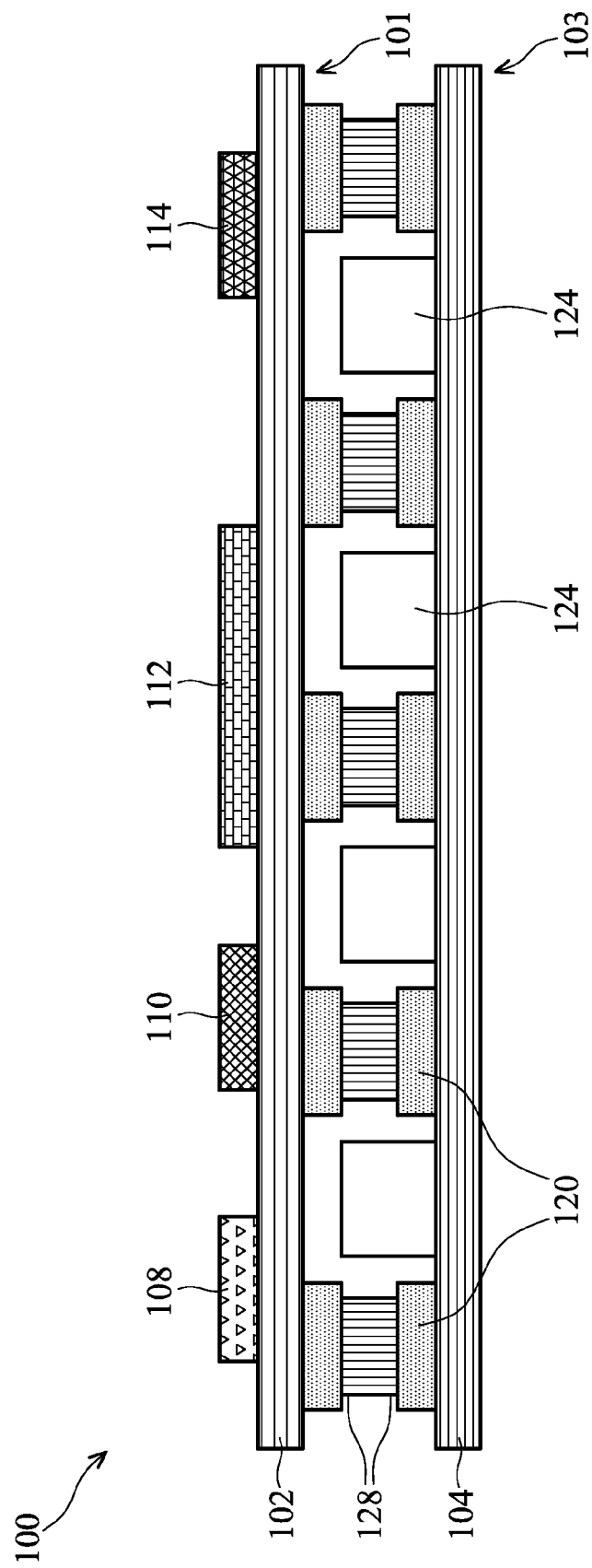

There are a number of techniques for reflowing solder, such as infrared reflow, hot gas reflow and vapor phase reflow. A preferred embodiment uses nitrogen gas or nitrogen gas enriched air in a convection oven. The resulting cross-sectional view of workpiece 100 is shown in FIG. 1C. Note that solder column 128 is about the diameter of solder ball 126, shown in FIG. 1B, due to the elasticity, the shrinkage in volume from solder paste power to solder metal, and loss of liquid, such as flux, in the reflow process. Further, as workpiece 100 is heated to liquidus, solder balls 118 (not shown) and solder particles in solder paste 122 (not shown) melt and the spaces between the solder particles collapse. Generally, the solder balls collapse from their pre-reflow condition.

After soldering, workpiece 100 may be washed to remove flux residue and any stray solder balls that could short out closely spaced component leads. Rosin flux is removed with fluorocarbon solvents, high flash point hydrocarbon solvents, or limonene. Water soluble fluxes are removed with deionized water and detergent, followed by an air blast to quickly remove residual water. When aesthetics are unimportant and the flux does not cause shorting or corrosion, flux residues are sometimes left on the workpieces, saving the cost of cleaning and eliminating the waste disposal.

The boards are visually inspected and/or x-rayed for missing or misaligned components and solder bridging, then sent to the testing stations to verify yield.

Figure 2A:
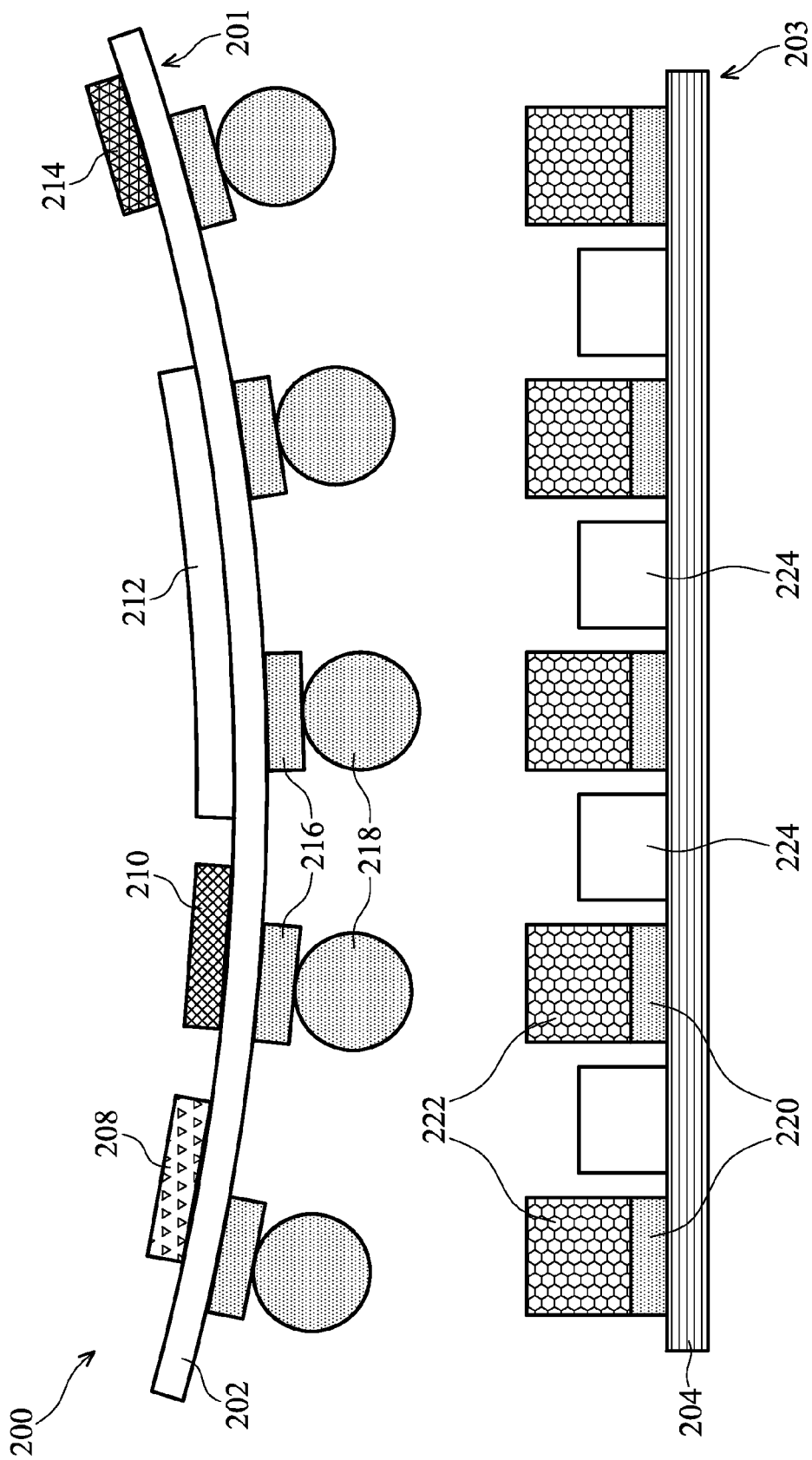
FIG. 2A and FIG. 2B are cross-sectional views of a multi-substrate assembly, with a warped module.
Figure 2B:
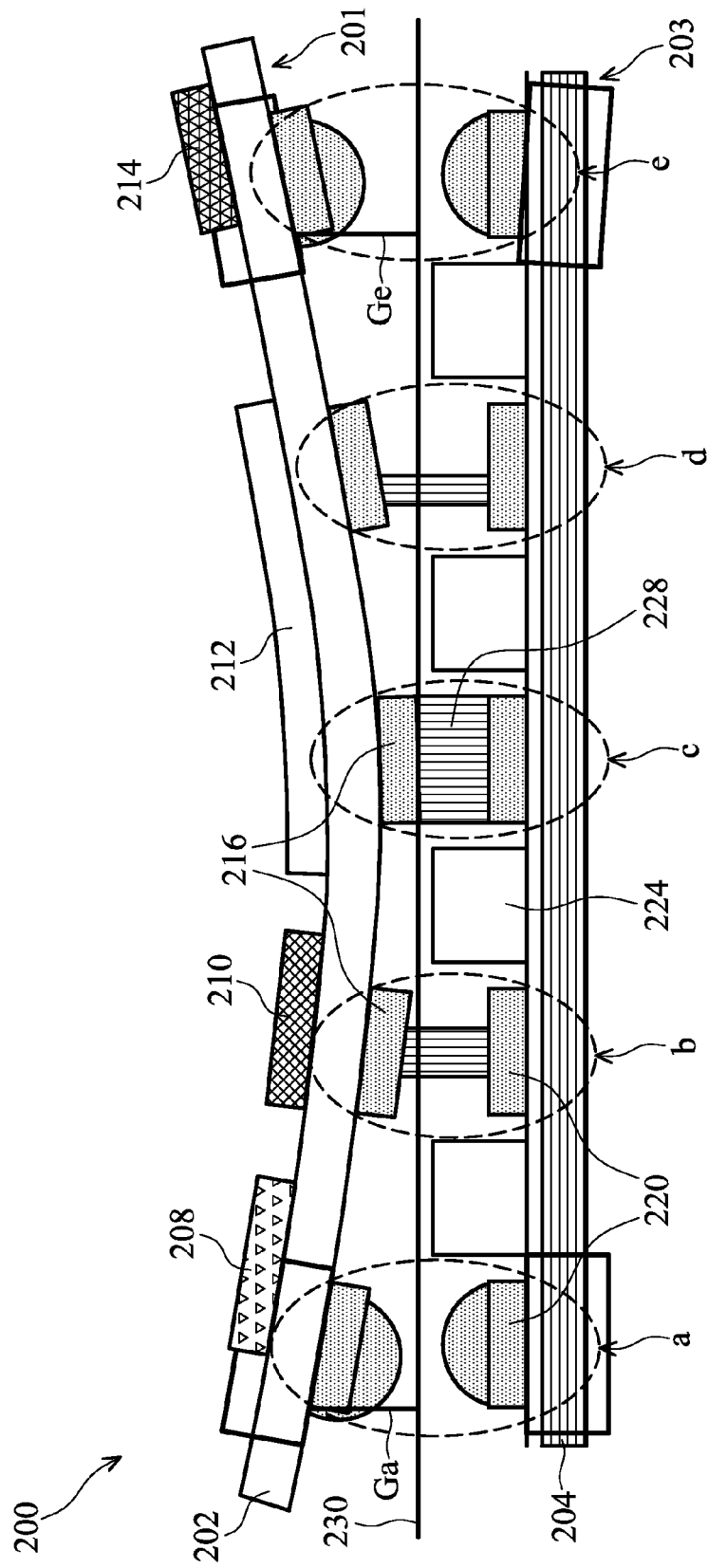

FIG. 2A and FIG. 2B are cross-sectional views of a prior art multi-substrate assembly, with a warped module. Turning first to FIG. 2A, workpiece 200 is shown before the surface mount process. Module 201 is warped. Warpage may be caused by differences in coefficient of thermal expansion of different parts of module 201, wherein interposer 202 warped due to differences in loading across the surface area of the interposer, or due to the size of module 201, or the like. In any case, warped module 201 is to be surface mounted to substrate 204. Workpiece 200 is portrayed as similar to workpiece 100 of FIG. 1 with similar and corresponding numbering. Therefore, each element will not be discussed herein. Obviously, however, module 201 is warped wherein module 101 is planar. The warpage of module 201 is exaggerated for illustration. Module 202 may have a warpage between about 4 mils and 8 mils, for example. PCB substrate 203 is comprised of substrate 204, with solder pads 220, solder paste 222, and solder mask 224, such as PCB substrate 103 in FIG. 1A.

FIG. 2B shows workpiece 200 following surface mount and reflow processes. Note that no solder column is formed in areas a and e. Gap distance Ga, between substrate 202 and optimum column height 230, and gap distance Ge, between substrate 202 and optimum column height 230, is too great for the solder to touch and form surface tension, which aids in creating a solder column. Therefore areas a and e are open, most likely causing a multi-substrate assembly failure. Further, in area d, solder column 230 is thin. Solder balls 218 closer to the center of module 201 collapse more than the solder balls closer to the external edges of module 201. A thin solder column may cause reliability and speed problems in multi-substrate assembly workpiece 200. Area c shows a normal solder column 228. FIG. 2B is an exaggerated example of a concave warped module in a prior art multi-substrate assembly.

Figure 3A:
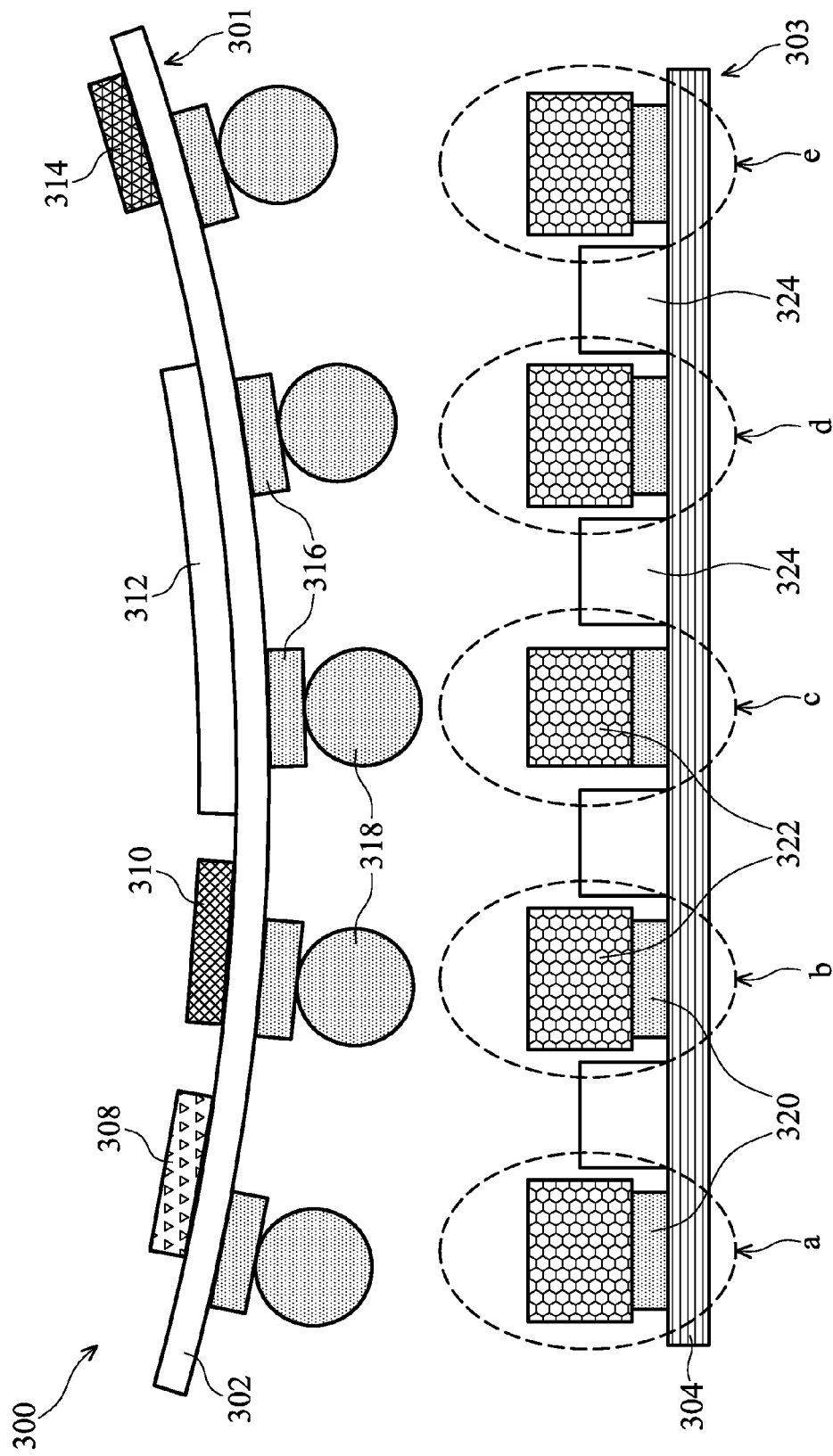
FIG. 3A and FIG. 3B are cross-sectional views of a multi-substrate assembly, with a warped module, in accordance with an illustrative embodiment.
Figure 3B:
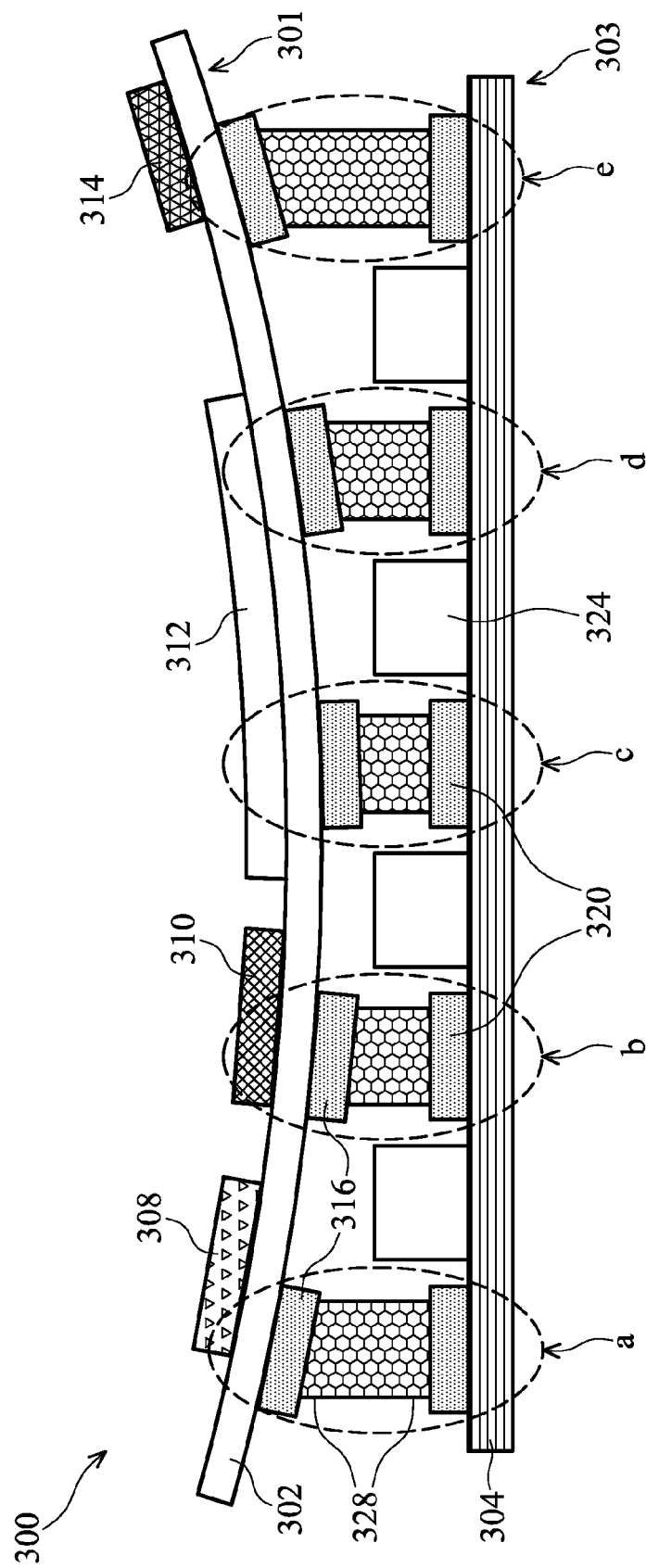

FIG. 3A and FIG. 3B are cross-sectional views of a multi-substrate assembly, with a warped module, in accordance with an illustrative embodiment. FIG. 3A shows the workpiece after solder is printed on substrate 304 and before surface mount. FIG. 3B shows the workpiece after reflow. Again, workpiece 300 is portrayed as similar to workpiece 100 of FIG. 1, with similar and corresponding numbering. Therefore, each element will not be discussed herein. However, module 301 is warped, wherein module 101 is planar. An advantage of an illustrative embodiment is that warped module 301 is successfully mounted to PCB substrate 303, in contrast to workpiece 200 in FIG. 2A. Note, in FIG. 3A, that solder paste 322 is adapted or oversized in comparison to solder pad 320 in areas a, b, d, and e. Moreover, solder paste 322 does not touch solder mask 324. In another embodiment, solder mask 324 may allow a larger open area surrounding solder pads 320 to avoid adapted solder paste 322. Solder paste 322 is adapted to compensate for the distances between substrate 304 and the optimum column height (area c, solder paste 322), in respective areas a-e. In the case of the gap distance in area c, no compensation is required. The solder paste height is determined by the height of the stencil used to print solder paste 322. Since the stencil is of uniform thickness, the solder paste in each area is the same height before reflow. An adapted aperture in an adapted stencil allows the corrected volume of solder paste to be printed by modifying the aperture radius.

Turning to FIG. 3B, workpiece 300 is shown following surface mount and reflow processes. Workpiece 300 shows solder columns 328 of uniform radius and differing heights in areas a, b, c, d, and e. The surface tension of the solder causes the solder paste to flow on to solder pads 320 and connect with solder balls 318 in FIG. 3A. Solder balls 318 and solder paste 322 (shown in FIG. 3A) collapse at liquidus during the reflow process resulting in the uniform and reliable multi-substrate assembly illustrated in FIG. 3B.

The example shown in FIGS. 3A and 3B illustrate a concave warped substrate, however an adaptive solder paste system, structure, and method may be employed on convex modules as well as modules and substrates of other distortions.

Figure 4:
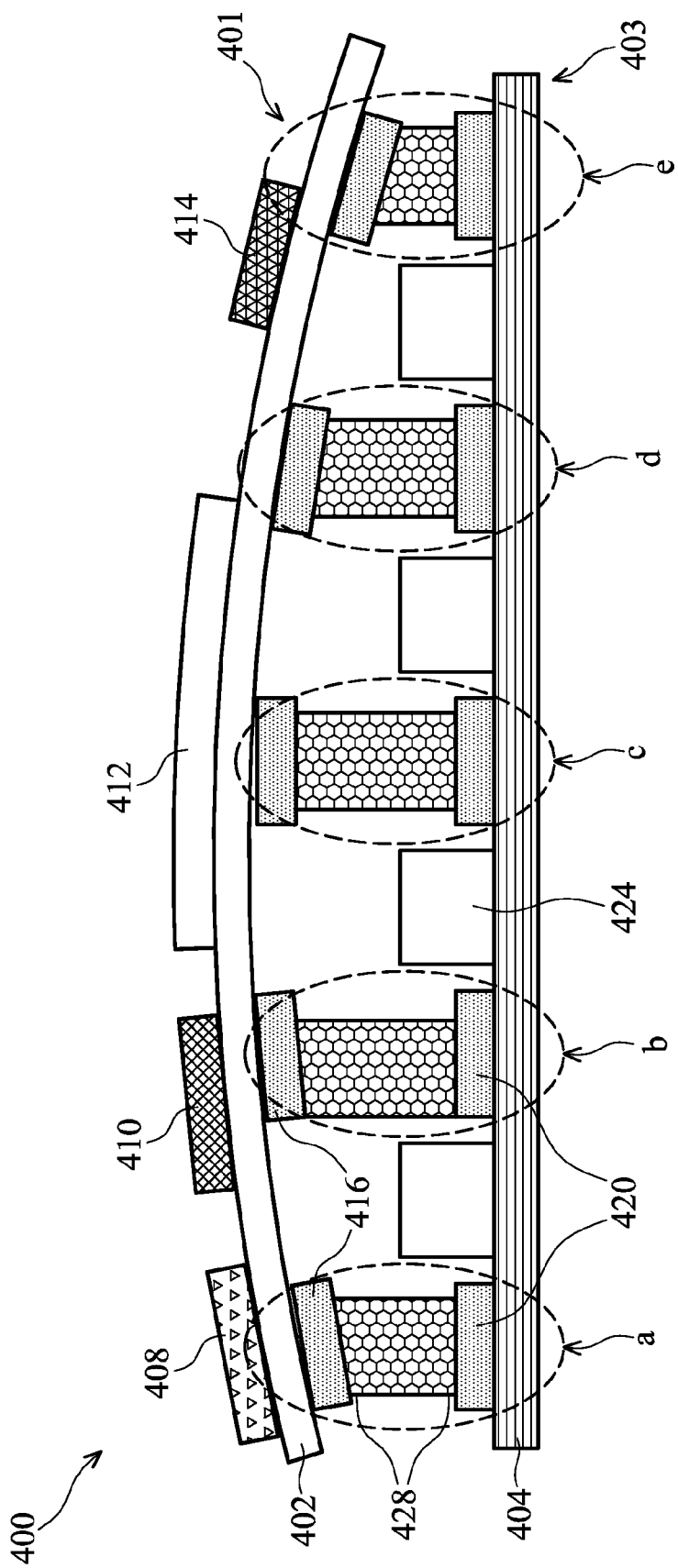
FIG. 4 is a cross-sectional view of a multi-substrate assembly with a warped module, in accordance with another aspect of the illustrative embodiments.

FIG. 4 is a cross-sectional view of a stacked substrate assembly in accordance with another aspect of the illustrative embodiments. Once again, workpiece 400 is portrayed as similar to workpiece 100 of FIG. 1, with similar and corresponding numbering. Therefore, each element will not be discussed herein. However, module 401 is convexly warped, wherein module 101 is planar. FIG. 4 shows convexly warped module 401 following surface mount and reflow processing. Note that areas a, b, c, d, and e all have solder columns 428 of similar radius and differing heights. In this illustrative embodiment, however, area c has the greatest distance between interposer 402 and substrate 404, therefore during the solder paste printing process the solder paste for area c was oversized by the greatest amount to compensate for the largest distance.

Figure 5:
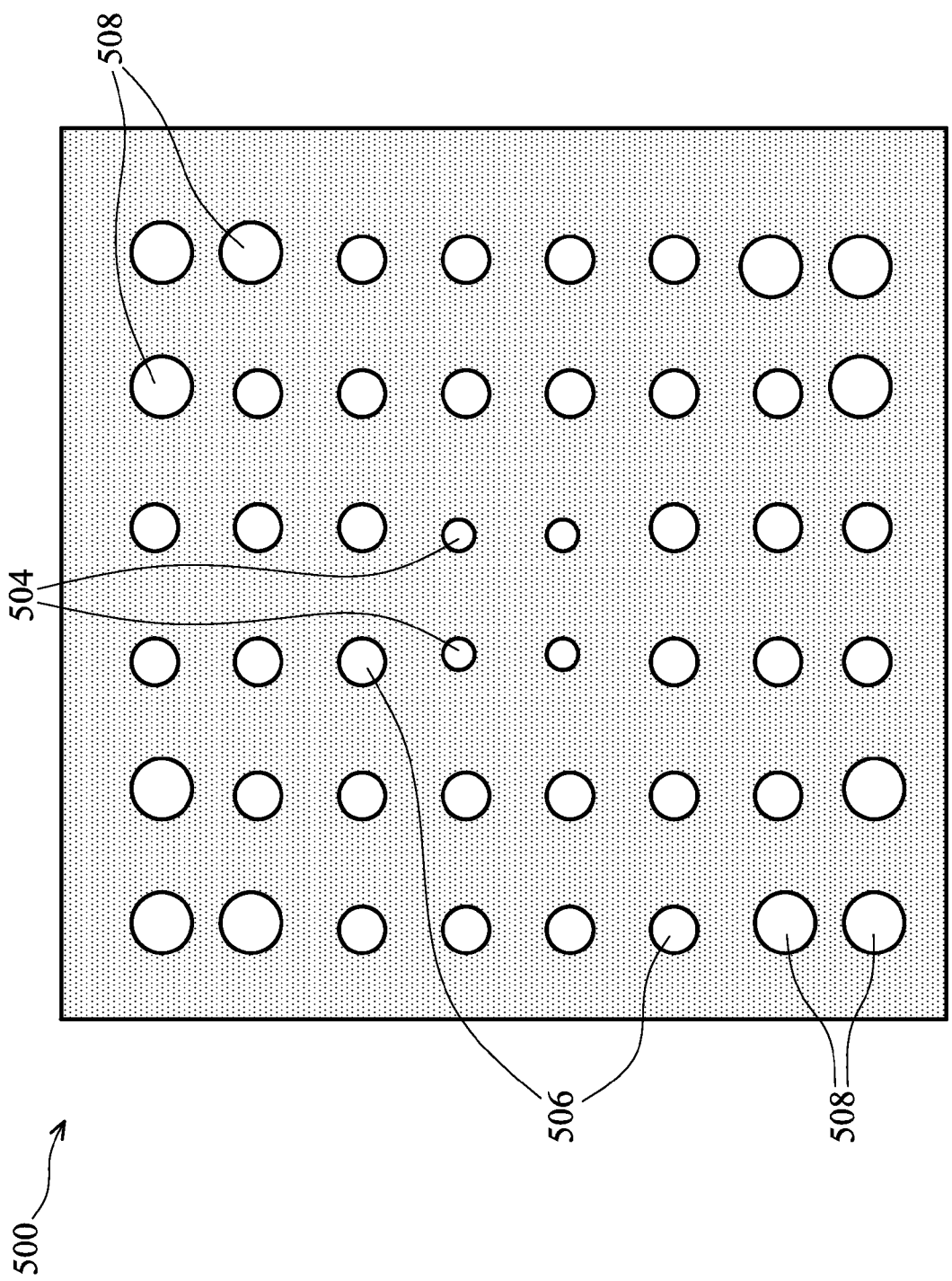
FIG. 5 is a plan view of an adaptive stencil in accordance with an illustrative embodiment.

FIG. 5 is a plan view of an adaptive stencil in accordance with an illustrative embodiment. The goal of stencil printing is to put the proper amount of solder paste in the proper location repeatably. The aperture size, shape, and stencil thickness determine the amount of solder deposited, while the position of the aperture determines the location of the solder paste deposit. In a preferred embodiment, the stencil is employed in a printer with a squeegee. The stencil is aligned to the PCB substrate of the multi-substrate assembly, with the bottom of the stencil toward the PCB and the top of the stencil exposed to the squeegee. A measured amount of solder paste is applied to the top of the stencil and the squeegee forces solder paste through the apertures and onto the PCB, printing the solder paste onto the PCB.

Adaptive stencil 500 may comprise any stiff material, preferably stainless steel, or the like. The stencil is of uniform thickness and may be about 5 mils thick, or for example, 4 mils, 6 mils, or 10 mils. An adapted stencil of any thickness is within the scope of these embodiments. Apertures such as small aperture 504, medium aperture 506, and large aperture 508 are formed in adaptive stencil 500 and placed on the stencil in locations corresponding to the locations of gap distances of a warped board. In other words, large apertures 508 correspond to locations on the PCB that have a larger gap. Small apertures 504 correspond to locations on the PCB that have no un-desired gap between the module and the solder pads of the PCB substrate. In other words, small apertures 504 may be at an optimum location on the board and be a target column height and radius and therefore do not need to be adapted for warpage. In addition, medium apertures 506 correspond to locations on the PCB that have a midsize gap between the module and the solder pads of the PCB substrate.

Of course, this illustration is greatly simplified. Many more apertures may be formed on a stencil in various pitches. First, apertures of any shape may be employed, including squares, rectangles, home plate, and radiused home plate shapes, for example. Second, many more sizes of apertures may be used on a single stencil. The size and shape of the apertures may be customized for each gap distance and location on the PCB. Further, groups of like modules may be sorted according to warpage and alternate stencils may be adapted for the solder printing process for each group.

Figure 6A:
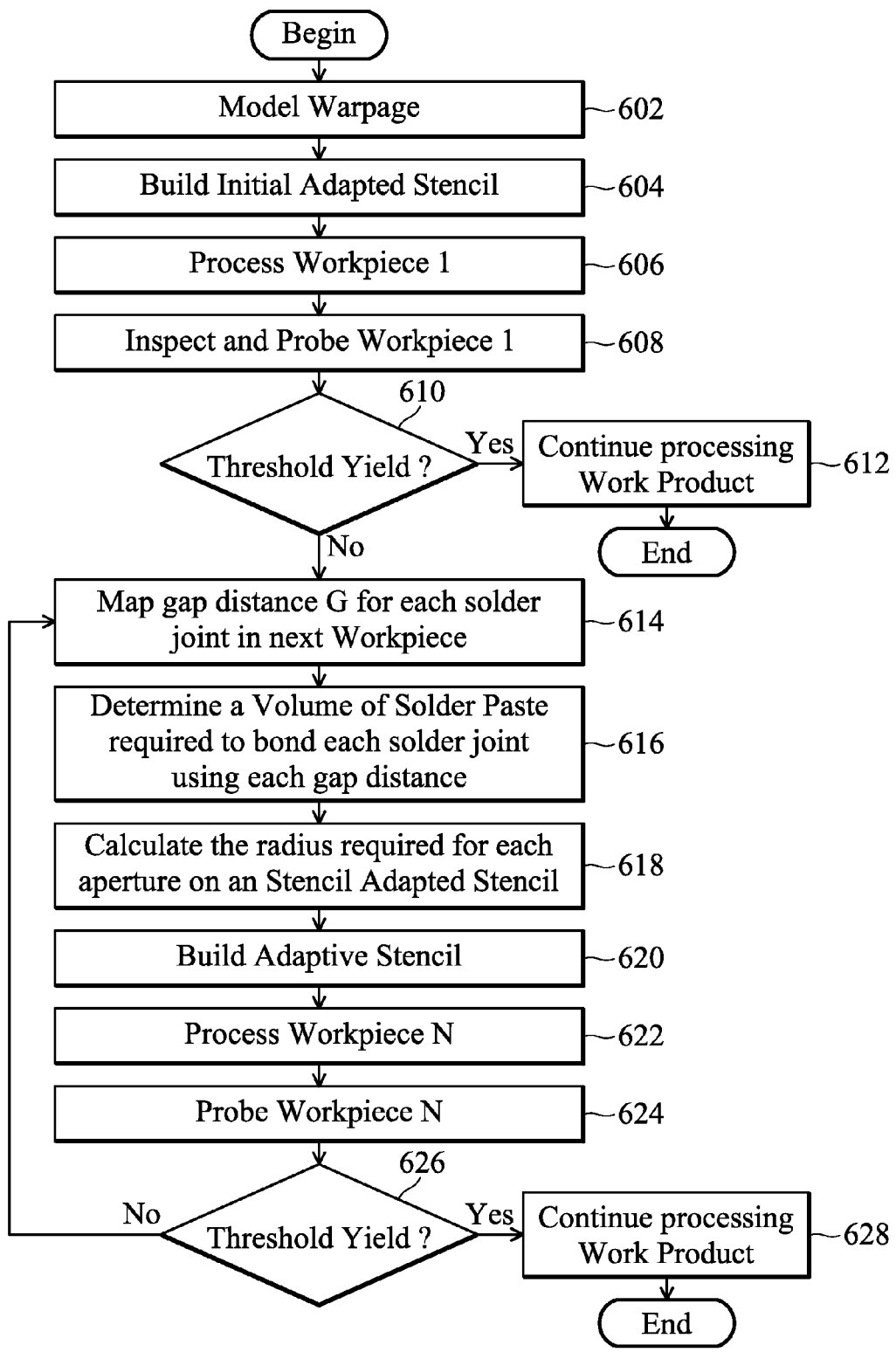
FIG. 6A is a flow chart of a method of making an adapted stencil in accordance with an aspect of the illustrative embodiments and FIG. 6B illustrates the relationship between volume of solder paste before reflow and the height of the resulting solder column after reflow.

FIG. 6A is a flow chart of a method of making an adapted stencil in accordance with an aspect of the illustrative embodiments. The method of making an adapted stencil begins with modeling the warpage anticipated of the assembly components, assembly design, and process temperature and stresses (step 602). From this initial model, an adapted stencil is built (step 604). Factors in stencil fabrication, such as whether the apertures are etched or laser cut are important considerations in stencil design that are known in the art, and therefore will not be discussed herein. To establish the initial adapted stencil an optimum BGA column radius and column height are determined using technology based parameters, such as in an embodiment, the column height is twice the radius of the column. Thus, the volume, height, and radius of an optimum column may be calculated using the equation below:

Volume of the solder ball+Volume of the solder paste/ 2*before reflow=Volume of the resultant BGA column after reflow    (1)

*Recall that the solder paste will collapse, typically halving the solder paste volume when the solder paste turns from power to solid metal. In another embodiment, a different solder paste type may collapse by a slightly different ratio. This ratio could be provided by the solder paste vendor. Equation (1) may be modified within the scope of these embodiments to compensate for different solder pastes types.

Equation (1) may be solved for the optimum radius ($R_o$) and optimum column height ($H_o$). In this embodiment $H_o=2R_o$. In other words, the height of the cylinder is optimum at twice the cylinder radius for this technology. Therefore equation (1) may be rewritten as:

$$4/3\pi R_{ball}^3 + (H_{stencil}\pi R_{stencil-aperture}^2)/2 = \pi R_o^2 2R_o \quad (2)$$

Wherein $R_{ball}$=the radius of the solder ball; $H_{stencil}$=the height (thickness) of the stencil; $R_{stencil-aperture}$=the radius of the stencil aperture at the specific xy coordinates of the BGA column, for example, in the case of a concave warp, the center location. All of the variables in equation (1) are known except for $R_o$, therefore, the solution of $R_o$ is straight forward.

Depending on the modeled warpage of the workpiece, gap G is determined for each stencil aperture. Gap G is the distance between the top of the optimum column height and the module substrate. Using $G_{xy}$ for each stencil aperture a volume of an adapted column may be calculated as follows:

$$\text{Volume of the adapted post solder column} = \pi R_o^2(H_o+G_{xy}) \quad (3)$$

The optimum radius remains the same as the height of the column changes. The solder tends to pull together to this optimum radius and push up due to the surface tension of the molten solder. Once the volume of the adapted post solder column is found, the radius of the adapted stencil aperture for each stencil aperture at xy may be found using the following equation:

$$\pi R_o^2(H_o+G_{xy}) = 4/3\pi R_{ball}^3 + (H_{stencil}\pi R_{adapted\ stencil-aperture\ xy}^2)/2 \quad (4)$$

Solving for $R_{adapted\ stencil-aperture\ xy}$:

$$R_{adapted\ stencil-aperture\ xy} = (2(\pi R_o^2(H_o+G_{xy}) - 4/3\pi R_{ball}^3)/\pi H_{stencil})^{1/2} \quad (5)$$

Thus, the initial adapted stencil may be designed and implemented.

Turning to step 606, a first workpiece is processed through solder print, surface mount, and reflow. The first workpiece is inspected, and electrically probed to determine functionality (step 608). If a threshold yield is achieved (yes to output of step 610) then remaining workpieces are processed using the initial stencil (step 612) and the process ends.

However, if the threshold yield is not achieved (no to output of step 610) then the gaps between the warped module and the substrate are measured and mapped (step 614). The preferred method of measuring the solder joints between each module and the PCB of the assembly is to employ a shadow moire technique. Shadow-moire interferometry is a well-established experimental technique that measures out-of-plane displacements (warpage). The workpiece to be measured is placed on a pedestal and covered with a glass grating of a set frequency. A collimated light source is directed onto the workpiece from an angle of 45 degrees. A moire pattern is created from the interference of the grating and the shadow of the grating projected onto the workpiece. The shadow of the grating is distorted due to the warpage of the workpiece. Moire fringes are then generated by the geometric interference of the shadow grating and the real reference grating. Fringes are lines composed by the points along the workpiece having equal distance between the grating and the surface of the sample. Using this method, the warpage, and therefore gap G of each solder joint, can be determined and mapped for the workpiece. In embodiments different methods of mapping the gap distances may be employed, such as Three Dimensional Thermal-Mechanical modeling, for example.

Turning to step 616, the volume of solder paste needed for each gap distance is determined. In the example shown in FIG. 3, a concavely warped substrate is bonded to a flat substrate. To calculate the additional volume of solder paste needed for a particular BGA solder column, the warpage at the xy coordinates of the BGA column as measured by the shadow moire method described above is employed. Gap G is added to optimum height $H_o$ and the volume of the adapted solder column is calculated, as it was with the initial workpiece, with the following equation:

$$\text{Volume of the adapted post solder column} = \pi R_o^2(H_0+G) \quad (3)$$

Again, the optimum radius remains the same as the height of the column changes, because the solder tends to pull together to this optimum radius and push up due to the surface tension of the molten solder.

Turning now to step 618, the radius of the adapted stencil aperture for each xy may be found using the following equation:

$$\pi R_o^2(H_o+G) = 4/3\pi R_{ball}^3 30 (H_{stencil}\pi R_{adapted\ stencil-aperture}^2)/2 \quad (4)$$

Solving for $R_{adapted\ stencil-aperture}$:

$$R_{adapted\ stencil-aperture} = (2(\pi R_o^2(H_o+G) - 4/3\pi R_{ball}^3)/\pi H_{stencil})^{1/2} \quad (5)$$

Figure 6B:
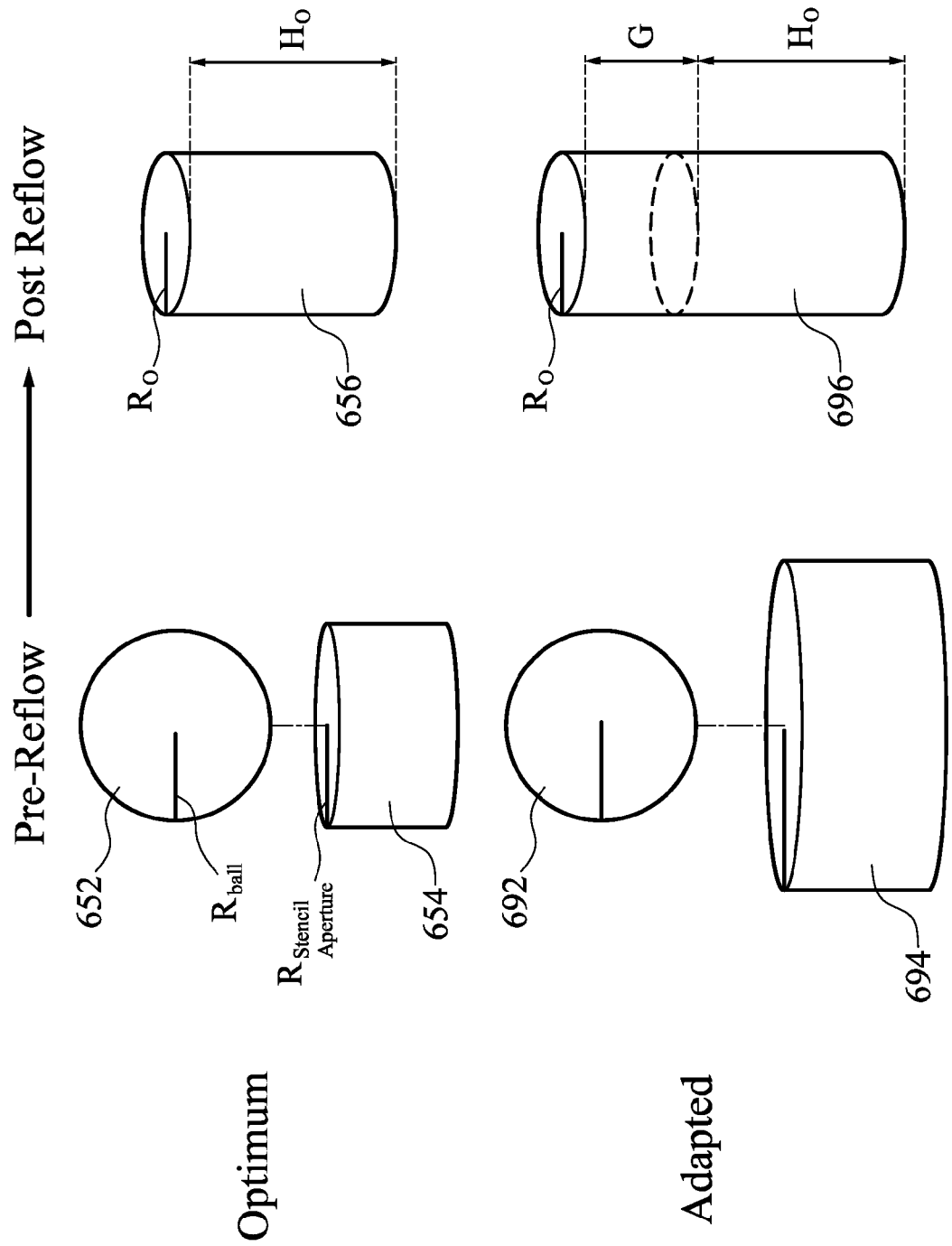

Turning briefly to FIG. 6B, an example case is presented. Solder ball 652 and optimum solder column 654 are shown pre-reflow and resultant optimum BGA column 656 is shown post reflow. As discussed above, $2R_o=H_o$. Solder ball 692 and adapted solder column 694 are shown pre-reflow and resultant adapted BGA column 696 is shown post reflow. The adapted BGA column 696 is higher than optimum BGA column 656 by gap G. In a specific example let $R_{stencil-aperture}$=10 mils, radius of the solder ball r=10 mils, stencil height $H_{stencil}$=5 mils, and G=4 mils. Replacing the known variables in equation (2) yields:

$$4/3\pi 10^3 + (5\pi 10^2)/2 = \pi R_o^2 2R_o$$

$$(4186+785)/2\pi = R_o^3$$

9.25 mils=$R_o$, therefore $H_o$=18.5 mils

To calculate the radius of the adapted stencil aperture, the volume of the adapted BGA column 696 is found by first adding gap G to optimum height $H_o$; 4+18.5=22.5, then finding the volume of the adapted BGA column by employing the equation for the volume of a cylinder:

$$\pi R_o^2 (22.5) = \text{volume of the adapted BGA column}$$

$$\pi (9.25)^2 (22.5) = 6045 \text{ mils}$$

Finally, to find the radius of the adapted stencil aperture, equation (1) is employed as follows:

$$\text{Volume of the solder ball} + \pi R_{adapted\ stencil\ aperture}^2 5/2 = \text{volume of the adapted BGA solder column};$$

$$4186 \text{ mils} + \pi R_{adapted\ stencil\ aperture}^2 5/2 = 6045 \text{ mils};$$

$$R_{adapted\ stencil\ aperture}^2 = 235.8;$$

$$R_{adapted\ stencil\ aperture} = 15.4 \text{ mils}$$

Thus, for the xy coordinates with a gap of 4 mils the adapted stencil aperture is 15.4 mils. Other gaps may thus be calculated for xy coordinates.

The warp of a substrate may be described as a function of x and y coordinates, for example, a "potato chip" type warp may be described as a parabolic function $y = ax^2 + H_o$. Combining a function to describe the warpage and therefore the gap of each xy coordinate and using the equations employed above, an illustrative embodiment may calculate all of the adapted stencil apertures using computer implemented instructions.

Returning to step 620 in FIG. 6A an adaptive stencil is built. A next workpiece is processed through solder print using the adaptive stencil and then is processed through pick and place and reflow (step 622). The next workpiece may be inspected and probed (step 624). If a threshold yield is met (yes output to step 626), the remaining workpieces are processed using the adapted stencil. If a threshold yield is not met (no output to step 626), the process returns to step 614.

Moreover, while the example embodiment had one warped substrate mounted to a flat substrate in a concave manner, it is within the scope of these embodiments that multiple warped substrates may be employed and differing types of warp may be adapted for using an adaptive substrate. Furthermore, not every solder joint gap must be measured or adapted to be within the scope of these embodiments. Selected solder columns may be measured or selected regional solder columns may be measured. An adapted stencil may be built for every warped device, or there may be a collection of "best-fit" adapted stencils based on the most common types of warpage seen.

Advantages of the various embodiments include providing a method and structure wherein the solder stencils are optimized for mounting warped substrates.

Although the illustrative embodiments and their advantages have been described in detail, it should be understood that various changes, substitutions, and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that dimensions may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of joining a first substrate to a second substrate, the method comprising:
    ascertaining a deviation from a nominal gap between the first substrate and the second substrate at a first region of the first substrate;
    binning the first substrate according to the ascertained deviation;
    determining a volume of solder paste necessary to compensate for the deviation from the nominal gap;
    selecting from amongst a plurality of adapted stencils, an adapted stencil for applying solder paste to the first substrate, the selection being based upon the bin in which the first substrate is binned;
    applying the volume of solder paste necessary to compensate for the deviation at the first region of the first substrate; and
    bonding the second substrate to the first substrate using, at least in part, the solder paste applied at the first region of the first substrate.

2. The method of claim 1, wherein one or both of the substrates are warped.

3. The method of claim 1, wherein the deviation from the nominal gap is ascertained by analysis of the design parameters of the first substrate, the second substrate, or both substrates.

4. The method of claim 1, wherein the deviation from the nominal gap is ascertained by measuring either the first substrate, the second substrate, or both substrates.

5. The method of claim 4, wherein the measuring is accomplished using a shadow moiré technique.

6. The method of claim 1, wherein applying the volume of solder paste to compensate for the deviation at the first region of the first substrate employs a stencil comprising an aperture that is adjusted to allow the determined amount of solder through the stencil.

7. The method of claim 1, wherein the volume of solder paste necessary to compensate for the deviation is calculated by Volume=$\pi R_o^2 (H_o + G)$, wherein $R_o$ is a radius of a nominal aperture, $H_o$ is a nominal solder column height, and G is the deviation of the solder column height from the nominal solder column height.

8. The method of claim 1, wherein applying the volume of solder paste necessary to compensate for the deviation comprises squeezing solder paste through a stencil having an aperture with a calculated radius.

9. The method of claim 8, wherein the radius of an adapted stencil aperture is calculated by $R_{adapted\ stencil\text{-}aperture} = (2(\pi R_o^2 (H_o + G) - 4/3 \pi R_{ball}^3)/\pi H_{stencil})^{1/2}$, wherein $R_o$ is the radius of a nominal aperture, $H_o$ is a nominal solder column height, G is the deviation of the solder column height from the nominal solder column height, $R_{ball}$ is the radius of a solder ball, and $H_{stencil}$ is the thickness of the stencil.

* * * * *